(12) United States Patent
Yoshida et al.

(10) Patent No.: US 7,065,866 B2
(45) Date of Patent: Jun. 27, 2006

(54) COMPONENT MOUNTING METHOD

(75) Inventors: Noriaki Yoshida, Ikeda (JP); Takeshi Takeda, Osaka-fu (JP); Akira Kabeshita, Hirakata (JP)

(73) Assignee: Matsushita Electric Industrial Co., Ltd., Osaka-fu (JP)

( * ) Notice: Subject to any disclaimer, the term of this patent is extended or adjusted under 35 U.S.C. 154(b) by 254 days.

(21) Appl. No.: 09/956,793

(22) Filed: Sep. 21, 2001

(65) Prior Publication Data

US 2002/0011000 A1 Jan. 31, 2002

Related U.S. Application Data

(62) Division of application No. 08/996,907, filed on Dec. 23, 1997, now Pat. No. 6,314,640.

(30) Foreign Application Priority Data

Dec. 26, 1996 (JP) ................... 8-347593

(51) Int. Cl.
  *H05K 3/30* (2006.01)
  *B23P 19/00* (2006.01)
(52) U.S. Cl. ............... 29/834; 29/832; 29/739; 29/593; 29/743; 474/102
(58) Field of Classification Search ............... 29/834, 29/832, 739, 740, 743, 712, 593, 833, 720; 474/102; 414/222.02
  See application file for complete search history.

(56) References Cited

U.S. PATENT DOCUMENTS

| 4,747,198 A | 5/1988 | Asai et al. |
| 4,787,270 A | 11/1988 | Sulca |
| 4,794,689 A | 1/1989 | Seno et al. |
| 4,810,154 A | * 3/1989 | Klemmer et al. ... 414/222.02 X |
| 5,115,559 A | 5/1992 | Oyama |
| 5,153,983 A | 10/1992 | Oyama |
| 5,249,349 A | * 10/1993 | Kuinose et al. ........... 29/740 X |
| 5,331,731 A | 7/1994 | Suzuki et al. |
| 5,384,956 A | 1/1995 | Sakurai et al. |
| 5,797,306 A | 8/1998 | Kufahl |

FOREIGN PATENT DOCUMENTS

| GB | 2 034 613 | | 6/1980 | |
| JP | 4-11800 | * | 1/1992 | ............... 29/834 |
| JP | 6-61689 | * | 3/1994 | ............... 29/739 |

OTHER PUBLICATIONS

Shigley et al., Mechanical Engineering Design, 4th Edition, McGraw-Hill, Inc., pp. 570-571.

* cited by examiner

*Primary Examiner*—A. Dexter Tugbang
(74) *Attorney, Agent, or Firm*—Wenderoth, Lind & Ponack, L.L.P.

(57) ABSTRACT

In accordance with a component mounting method, a component stored in a component feeder is held by a component holding member and is then mounted in a mounting position on an object. The method includes, when a mounting posture of the component in which the component is mounted onto the object is inclined with respect to a basic posture of the component by a mounting angle, the operation of holding the component from the component feeder by the component holding member that has preliminarily been rotated to the mounting angle in such a direction as to depart from a reference posture of the component holding member prior to the mounting of the component on the object. And afterwards, the component holding member is rotated in a specified direction to finally return the component holding member to the reference posture, and then the component is mounted on the object.

14 Claims, 9 Drawing Sheets

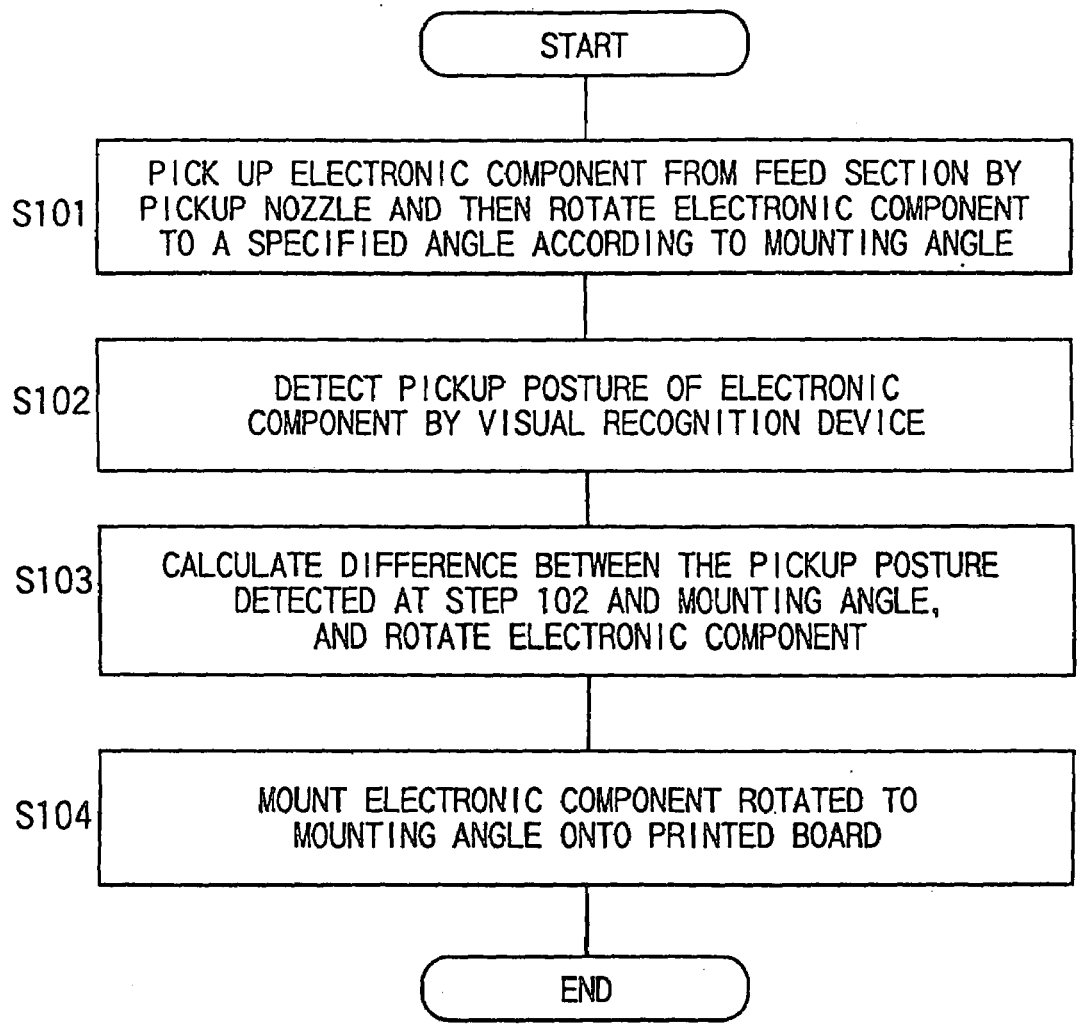

COMPONENT MOUNTING METHOD

This is a divisional application of Ser. No. 08/996,907, filed Dec. 23, 1997 now U.S. Pat. No. 6,314,640.

BACKGROUND OF THE INVENTION

The present invention relates to component mounting method and apparatus for mounting, for example, a component such as an electronic, mechanical, or optical component to a specified position on an object to be mounted such as a printed circuit board. More particularly, the invention relates to component mounting method and apparatus which make it possible to mount the component on the object with high precision, by driving a rotating mechanism so that the component will be rotated in one direction, with a view to suppressing the occurrence of lost motions of the rotating mechanism in correcting the postural angle of the component during the mounting operation.

FIG. 14 is a perspective view of a conventional electronic component mounting apparatus 100 for mounting electronic components. A conveyor 132 conveys circuit boards to and from the electronic component mounting apparatus 100, and further holds the circuit boards during production. Electronic component feeders 133 and 134 store and feed electronic components to be mounted on the circuit boards. The electronic component feeder 133 is a reel type electronic component feeder in which electronic components are stored on a reel, and the electronic component feeder 134 is a tray type electronic component feeder in which electronic components are stored on a tray. A component pickup head 136, which is equipped with a nozzle 138 for picking up an electronic component from the electronic component feeders 133, 134, performs up and down motions, rotating motion and other motions of the nozzle 138. The rotating motion is effected by a rotating mechanism connected to the component pickup head 136. The component pickup head 136 is provided with a second component recognition camera 11 for capturing an image of the electronic component from above. A component recognition camera 137 is provided for capturing, from below, an image of the posture of the electronic component picked up by the nozzle 138. An X-Y robot 135 moves the component pickup head 136 in X and Y directions.

The electronic component mounting apparatus 100 performs the following operations. For picking up an electronic component, the X-Y robot 135 moves the component pickup head 136, i.e. the nozzle 138, to an electronic-component pickup position in the electronic component feeder 133 or 134 and then lowers the nozzle 138 to pick up an electronic component. The nozzle 138 is lifted after the pickup.

Next, as shown at Step ("S" in the drawings) 101 of FIG. 16, the nozzle 138, after picking up the electronic component, is rotated by the rotating mechanism circumferentially of the nozzle 138 about the center axis of the nozzle 138, according to a mounting angle preset for the picked-up electronic component. Subsequently, at Step 102, the X-Y robot 135 moves the component pickup head 136 to the location of the component recognition camera 137, where the posture of the electronic component picked up by the nozzle 138 is recognized by the component recognition camera 137. Next, at Step 103, a difference between the actual angle of the picked-up electronic component and the mounting angle is determined based on the recognition result, and an angular correction for the picked-up electronic component is performed so that the difference value becomes zero. This correction is performed by rotating the nozzle 138, which is effected by again driving the rotating mechanism. Then, at Step 104, the electronic component, picked up by the nozzle 138, is moved to a specified position on the electronic circuit board in the X-and Y-directions by the component pickup head 136, which is moved by the X-Y robot 135. Further with an operation of the component pickup head 136, the nozzle 138 is lowered so that the electronic component is mounted to the specified component mounting position-on the electronic circuit board, where the electronic component is released from the, pickup head. By iterating these operations, electronic components are removed one after another from the electronic component feeder 133 or 134 and mounted onto the electronic circuit board.

The aforementioned rotating mechanism for the nozzle 138 is shown in FIG. 15. The nozzle 138 is fixed to a gear 102 so as to be inserted through center part of the gear 102. The gear 102 is connected to a motor output shaft 105 via a timing belt 101. Accordingly, rotation of the output shaft 105 is transferred to the pickup nozzle 138 via the gear 102 by the timing belt 101, by which the electronic component picked up by the pickup nozzle 138 is rotated to the specified mounting angle.

However, the timing belt 101 or the gear 102 has a backlash. Moreover, depending on whether the angle of the electronic component is too large or too small relative to the target mounting angle, the direction in which the nozzle 138 is rotated differs. Therefore, by rotating the nozzle 138 clockwise, or counterclockwise, or clockwise and counterclockwise together with the gear 102 or the like, there can occur an error in the final mounting angle of the electronic component due to the backlash.

To suppress the occurrence of such errors, the resolution of the timing belt 101 or the gear 102 is enhanced or a mechanism which directly, transforms rotation of the motor output shaft into rotation of the pickup nozzle is adopted, responsive to the required precision. However, this increases the manufacturing cost, and requires a large space for the installation of the motor and the nozzle 138.

SUMMARY OF THE INVENTION

The present invention has been accomplished to solve these and other issues. An object of the present invention is therefore to provide a component mounting method and apparatus which allow a component to be mounted at a mounting angle with good precision.

In accomplishing these and other objects, according to a first aspect of the present invention, there is provided a component mounting method by which a component stored in a component feeder is held by a component holding member for holding the component and is then mounted in a mounting position on an object. The method comprising: when a mounting posture of the component in which the component is mounted onto the object is inclined with respect to a basic posture of the component by amounting angle, holding the component from the component feeder by the component holding member that has preliminarily been rotated to the mounting angle in such a direction so as to depart from a reference posture of the component holding member prior to the mounting of the component to the object, and afterwards, rotating the component holding member in a specified direction to finally return the component holding member to the reference posture, and then mounting the component on the object.

According to a second aspect of the present invention, there is provided a component mounting method by which a component stored in a component feeder is held by a component holding member for holding the component and then mounted to a mounting position on an object to be mounted. The method comprising: a mounting posture of the component in which the component is mounted onto the object is inclined with respect to a basic posture of the component by a mounting angle, detecting that the posture of the component in the component feeder is inclined with respect to an ideal position by a component posture angle by recognizing by a recognition device the component fed by the component feeder; based on the mounting angle and the component posture angle, calculating a pre-holding rotational angle, which is an angle for preliminarily rotating the component holding member before holding the component; holding the component from the component feeder by the component holding member that has preliminarily been rotated to the pre-holding rotational angle in such a direction as to depart from a reference posture of the component holding member; and rotating the component holding member in a specified direction to finally return the component holding member to the reference posture, and then mounting the component on the object.

According to a third aspect of the present invention, there is provided a component mounting method according to the first aspect, wherein the component holding member is rotated circumferentially of the component holding member by a driving device via a transfer member which causes an error to occur in a rotational angle of the component holding member only when the component holding member is rotated in one direction and not to occur when the component holding member is rotated in the other direction that is opposite to the one direction and corresponding to the specified direction. The component holding member works to mount the component to the object in the reference posture in the rotational direction about a center axis of the component holding member, and the transfer member being, when gears are fitted to an output shaft of the driving: device and the component holding member, respectively, a toothed belt for coupling the gear of the output shaft and the gear of the component holding member with each other, in which constitution arrangement that an error occurs to the rotational angle of the component holding member only when the component holding member is rotated in one direction and does not occur when the component holding member is rotated in the other direction means that the gear of the component holding member is normally urged in the other direction against the toothed belt, so that when the component holding member is rotated in the one direction, an error corresponding to a backlash between the gear of the component holding member and the toothed belt occurs, while when the component holding member is rotated in the other direction, no backlash takes place between the gear of the component holding member and the toothed belt so that no error occurs to the rotational angle of the component holding member.

According to a fourth aspect of the present invention, there is provided a component mounting method according to the second aspect. In particular, the component holding member is rotated circumferentially of the component holding member by a driving device via a transfer member which causes an error to occur in the rotational angle of the component holding member only when the component holding member is rotated in one direction and not to occur when the component holding member is rotated in the other direction that is opposite to the one direction and corresponding to the specified direction. The component holding member works to mount the component to the object in the reference posture in the rotational direction about a center axis of the component holding member, and the transfer member being, when gears are fitted to an output shaft of the driving device and the component holding member, respectively, a toothed belt for coupling the gear of the output shaft and the gear of the component holding member with each other, in which constitution arrangement that an error occurs to the rotational angle of the component holding member only when the component holding member is rotated in one direction and does not occur when the component holding member is rotated in the other direction means that the gear of the component holding member is normally urged in the other direction against the toothed belt. Thus, when the component holding member is rotated in the one direction, an error corresponding to a backlash between the gear of the component holding member and the toothed belt occurs, while when the component holding member is rotated in the other direction, no backlash takes place between the gear of the component holding member and the toothed belt so that no error occurs to the rotational angle of the component holding member.

According to a fifth aspect of the present invention, there is provided a component mounting method by which a component stored in a component feeder is held by a component holding member for holding a component and then mounted to a mounting position on an object to be mounted. The component holding member is rotated circumferentially by a driving device via a transfer member which causes an error to occur in the rotational angle of the component holding member only when the component holding member is rotated in one direction and not to occur when the component holding member is rotated in the other direction that is opposite to the one direction. The component holding member works to mount the component to the object in a reference posture in the rotational direction about a center axis of the component holding member; and that when a mounting posture of the component in which the component is mounted onto the object is inclined with respect to a basic posture of the component by a mounting angle with an origin of a coordinate system on the object taken as a center. The method comprises: detecting that the posture of the component in the component feeder is inclined with respect to an ideal position by a component posture angle with an origin of a coordinate system of the component feeder taken as a center, by recognizing by a recognition device the component fed by the component feeder; based on the mounting angle and the component posture angle, calculating a pre-holding rotational angle, which is an angle for preliminarily rotating the component holding member before holding the component; on condition that a direction of rotation in which the component holding member is rotated in the one direction from the reference posture is regarded as being of positive angle, while a direction of rotation in which the component holding member is rotated in the other direction is regarded as being of negative angle, calculating the pre-holding rotational angle and then deciding whether the pre-holding rotational angle is positive or negative; if the pre-holding rotational angle is zero or positive, holding the component from the component feeder by the component holding member that has preliminarily been rotated to the pre-holding rotational angle in the one direction from the reference posture, and then rotating the component holding member in the other direction to the pre-holding rotational angle via the transfer member to return the component holding member to the reference posture, and then mounting the component on the object; and meanwhile, if the pre-holding rotational angle is negative, holding the component from the component feeder by the component holding member that has preliminarily been rotated to the pre-holding rotational angle in the other direction from the reference posture, and then rotating the component holding member in the one direction to an angle resulting from adding a return angle to the pre-holding rotational angle to return the component holding member to the reference posture, and afterwards rotating the component holding member in the other direction to the return angle to return the component holding member to the reference posture, and then mounting the component on the object.

According to a sixth aspect of the present invention, there is provided a component mounting method according to the fifth aspect. The transfer member is, when gears are fitted to an output shaft of the driving device and the component holding member, respectively, a toothed belt for coupling the gear of the output shaft and the gear of the component holding member with each other, in which constitution the arrangement that an error occurs to the rotational angle of the component holding member only when the component holding member is rotated in one direction and does not occur when the component holding member is rotated in the other direction means that the gear of the component holding member is normally urged in the other direction against the toothed belt, so that when the component holding member is rotated in the one direction, an error corresponding to a backlash between the gear of the component holding member and the toothed belt occurs, while when the component holding member is rotated in the other direction, no backlash takes place between the gear of the component holding member and the toothed belt so that no error occurs to the rotational angle of the component holding member.

According to a seventh aspect of the present invention, there is provided a component mounting apparatus by which a component stored in a component feeder is held by a component holding member and then mounted on a mounting position of an object. The apparatus comprising: a controller for performing control operations of, when a mounting posture of the component in which the component is mounted onto the object is inclined with respect to a basic posture of the component by a mounting angle, holding the component from the component feeder by the component holding member has preliminarily been rotated to the mounting angle in such a direction as to depart from a reference posture of the component holding member prior to the mounting of the component to the object, and afterwards, rotating component holding member in a specified direction to finally return the component holding member to the reference posture, and then mounting the component on the object.

According to an eighth aspect of the present invention, there is provided a component mounting apparatus by which a component stored in a component feeder is held by a component holding member for holding the component and then mounted in a mounting position on an object. The apparatus comprising: a controller for performing control operations of, when a mounting posture of the component in which the component is mounted onto the object is inclined with respect to a basic posture of the component by a mounting angle, detecting that the posture of the component in the component feeder is inclined with respect to an ideal position by a component posture angle by recognizing by a recognition device the component fed by the component feeder; based on the mounting angle and the component posture angle, calculating a pre-holding rotational angle, which is an angle for preliminarily rotating the component holding member before holding the component; holding the component from the component feeder by the component holding member that has preliminarily been rotated to the pre-holding rotational angle in such a direction as to depart from a reference posture of the component holding member; and rotating the component holding member in a specified direction to finally return the component holding member to the reference posture, and then mounting the component on the object.

According to a ninth aspect of the present invention, there is provided a component mounting apparatus according to the seventh aspect. In particular, the component holding member is rotated circumferentially of the component holding member by a driving device via a transfer member which causes an error to occur in a rotational angle of the component holding member only when the component holding member is rotated in one direction and not to occur when the component holding member is rotated in the other direction that is opposite to the one direction and corresponding to the specified direction. The component holding member works to mount the component to the object in the reference posture in the rotational direction about a center axis of the component holding member, and the transfer member being, when gears are fitted to an output shaft of the driving device and the component holding member, respectively, a toothed belt for coupling the gear of the output shaft and the gear of the component holding member with each other, in which constitution the arrangement that an error occurs in the rotational angle of the component holding member only when the component holding member is rotated in one direction and does not occur when the component holding member is rotated in the other direction means that the gear of the component holding member is normally urged in the other direction against the toothed belt, so that when the component holding member is rotated in the one direction, an error corresponding to a backlash between the gear of the component holding member and the toothed belt occurs, while when the component holding member is rotated in the other direction, no backlash takes place between the gear of the component holding member and the toothed belt so that no error occurs to the rotational angle of the component holding member.

According to a tenth aspect of the present invention, there is provided a component mounting apparatus according to the eighth aspect. In particular, the component holding member is rotated circumferentially of the component holding member by a driving device via a transfer member which causes an error to occur in the rotational angle of the component holding member only when the component holding member is rotated in one direction and not to occur when the component holding member is rotated in the other opposite to the one direction and corresponding to the specified direction. The component holding member works to mount the component on the object in the reference posture in the rotational direction about a center axis of the component holding member, and the transfer member being, when gears are fitted to an output direction that shaft of the driving device and the component holding member, respectively, a toothed belt for coupling the gear of the output shaft and the gear of the component holding member with each other, in which constitution the arrangement that an error occurs to the rotational angle of the component holding member only when the component holding member is rotated in one direction and does not occur when the component holding member is rotated in the other direction means that the gear of the component holding member is normally urged in the other direction against the toothed belt, so that when the component holding member is rotated in the one direction, an error corresponding to a backlash between the gear of the component holding member and the toothed belt occurs, while when the component holding member is rotated in the other direction, no backlash takes place between the gear of the component holding member and the toothed belt so that no error occurs to the rotational angle of the component holding member.

According to an eleventh aspect of the present invention, there is provided a component mounting apparatus by which a component stored in a component feeder is held by a component holding member for holding a component and then mounted in a mounting position on an object. The component holding member is rotated circumferentially of the component holding member by a driving device via a transfer member which causes an error to occur in the rotational angle of the component holding member only when the component holding member is rotated in one direction and not to occur when the component holding member is rotated in the other direction that is opposite to the one direction. The component holding member works to mount the component on the object in a reference posture in the rotational direction about a center axis of the component holding member; and that when a mounting posture of the component in which the component is mounted onto the object is inclined with respect to a basic posture of the component by a mounting angle with an origin of a coordinate system on the object taken as a center. The apparatus comprises: a controller for performing control operations of, detecting that the posture of the component in the component feeder is inclined with respect to an ideal position by a component posture angle with an origin of a coordinate system of the component feeder taken as a center, by recognizing with a recognition device the component fed by the component feeder; based on the mounting angle and the component posture angle, calculating a pre-holding rotational angle, which is an angle for preliminarily rotating the component holding member before holding the component; on condition that a direction of rotation in which the component holding member is rotated in the one direction from the reference posture is regarded as being of positive angle, while a direction of rotation in which the component holding member is rotated in the other direction is regarded as being of negative angle, calculating the pre-holding rotational angle and then deciding whether the pre-holding rotational angle is positive or negative; if the pre-holding rotational angle is zero or positive, holding the component from the component feeder with the component holding member that has preliminarily been rotated to the pre-holding rotational angle in the one direction from the reference posture, and then rotating the component holding member in the other direction to the pre-holding rotational angle via the transfer member to return the component holding member to the reference posture, and then mounting the component on the object. And, if the pre-holding rotational angle is negative, holding the component from the component feeder with the component holding member that has preliminarily been rotated to the pre-holding rotational angle in the other direction from the reference posture, and then rotating the component holding member in the one direction to an angle resulting from adding a return angle to the pre-holding rotational angle to return the component holding member to the reference posture, and afterwards rotating the component holding member in the other direction to the return angle to return the component holding member to the reference posture, and then mounting the component on the object.

According to a twelfth aspect of the present invention, there is provided a component mounting apparatus according to the eleventh aspect. In particular, the transfer member is, when gears are fitted to an output shaft of the driving device and the component holding member, respectively, a toothed belt for coupling the gear of the output shaft and the gear of the component holding member with each other, in which constitution the arrangement that an error occurs in the rotational angle of the component holding member only when the component holding member is rotated in one direction and does not occur when the component holding member is rotated in the other direction means that the gear of the component holding member is normally urged in the other direction against the toothed belt, so that when the component holding member is rotated in the one direction, an error corresponding to a backlash between the gear of the component holding member and the toothed belt occurs. However, when the component holding member is rotated in the other direction, no backlash takes place between the gear of the component holding member and the toothed belt so that no error occurs to the rotational angle of the component holding member.

BRIEF DESCRIPTION OF THE DRAWINGS

These and other aspects and features of the present invention will become clear from the following description taken in conjunction with the preferred embodiments thereof with references to the accompanying drawings, in which:

FIG. 16 is a flow chart showing an operation of the component mounting apparatus shown in FIG. 14.

DETAILED DESCRIPTION OF THE PREFERRED EMBODIMENTS

Figure 1:
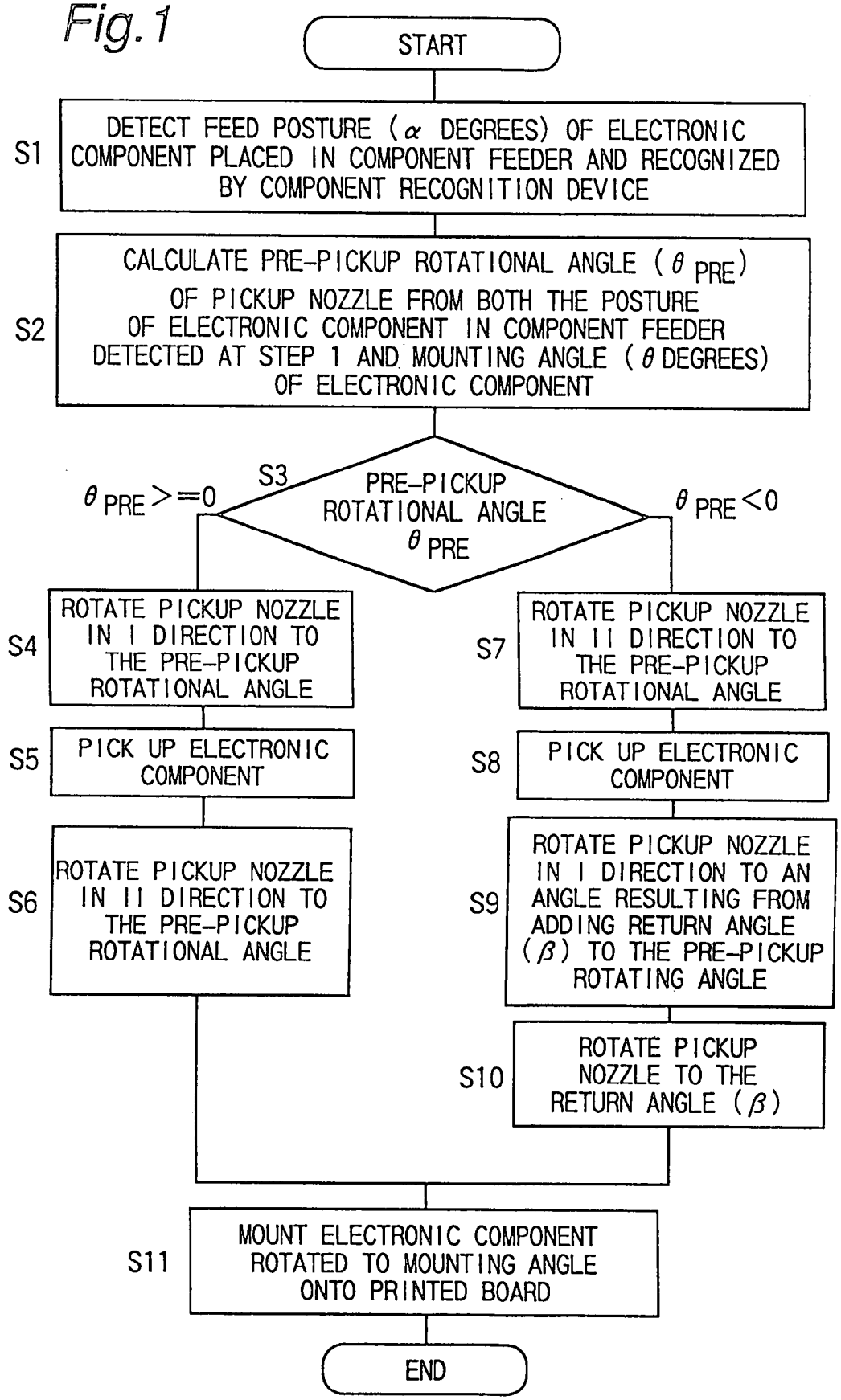
FIG. 1 is a flow chart showing operation of a component mounting method according to an embodiment of the present invention.

Before the description of the present invention proceeds, it is to be noted that like parts are designated by like reference numerals throughout the accompanying drawings.

Figure 14:
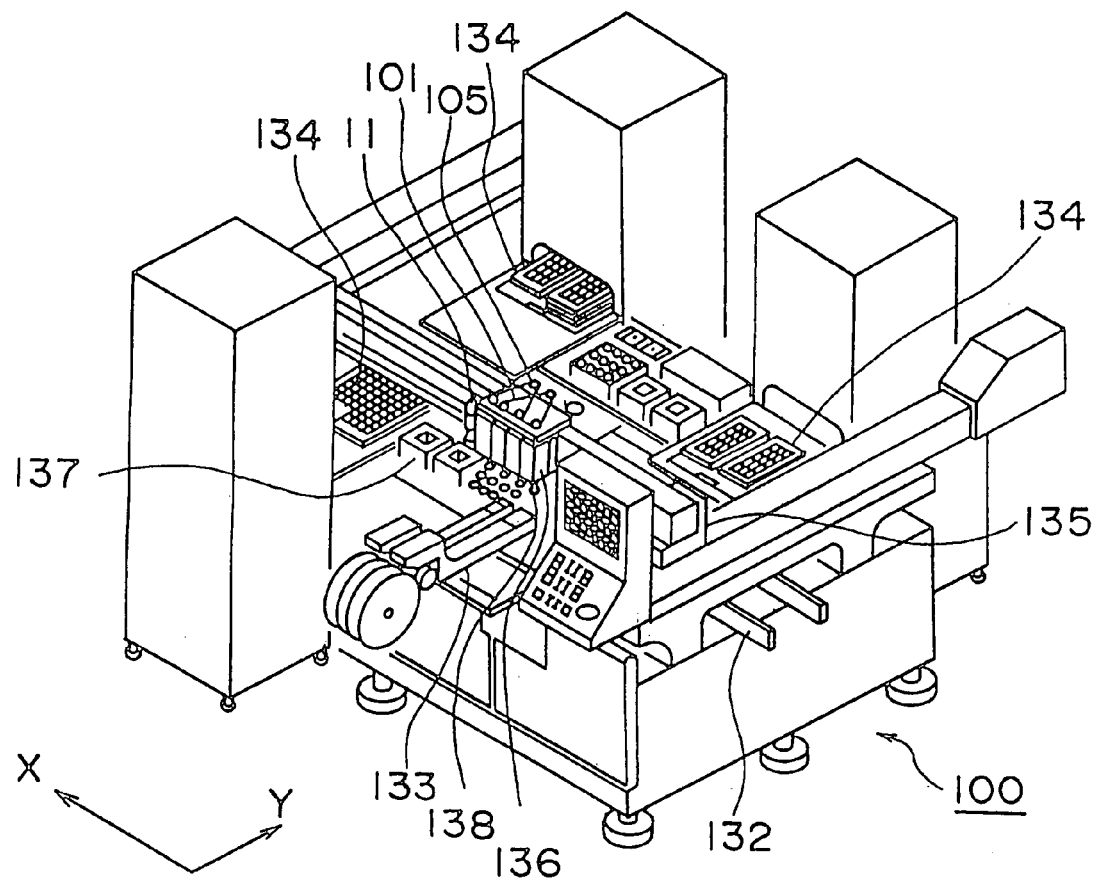
FIG. 14 is a perspective view showing a conventional component mounting apparatus.
Figure 15:
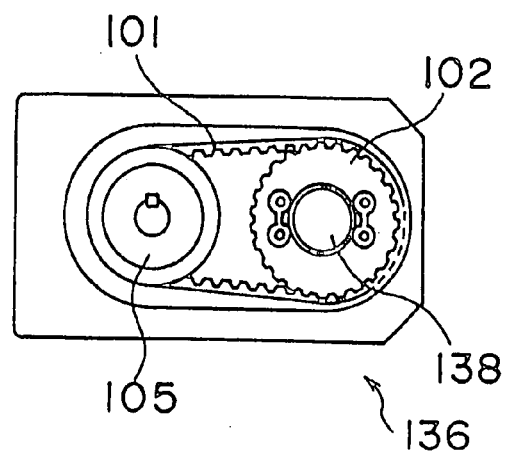
FIG. 15 is a view showing an engagement state between a belt and a gear within a component pickup head of the component mounting apparatus shown in FIG. 14.

A component mounting method and a component mounting apparatus, which are one embodiment of the present invention, are described below with reference to the accompanying drawings. The present component mounting method is to be executed by the present component mounting apparatus. Throughout the drawings including FIGS. 14 and 15 mentioned above, like constituent parts are designated by like reference numerals and their description is omitted. In addition, one embodiment that fulfills the function of the transfer member corresponds to the timing belt 101. Also, one embodiment that fulfills the function of the component recognition device corresponds to the second component recognition camera 11. Also, one direction corresponds to direction I while the specified direction and the other direction correspond to direction II.

In order to prevent the occurrence of errors in the final mounting angle of an electronic component due to the backlash as described above, the component mounting method and apparatus of this embodiment are arranged so that the rotational direction in which the rotational angle of the pickup nozzle 138 is finally adjusted for mounting the component by the pickup nozzle 138. The rotational direction is at all times in a direction such that rotational errors will never occur at the pickup nozzle 138, as detailed later. That rotational errors will never occur means that there will occur no mounting trouble in relation to the mounting precision at which the electronic component is mounted onto the circuit board, serving as an object to be mounted, by the pickup nozzle 138.

Figure 2:
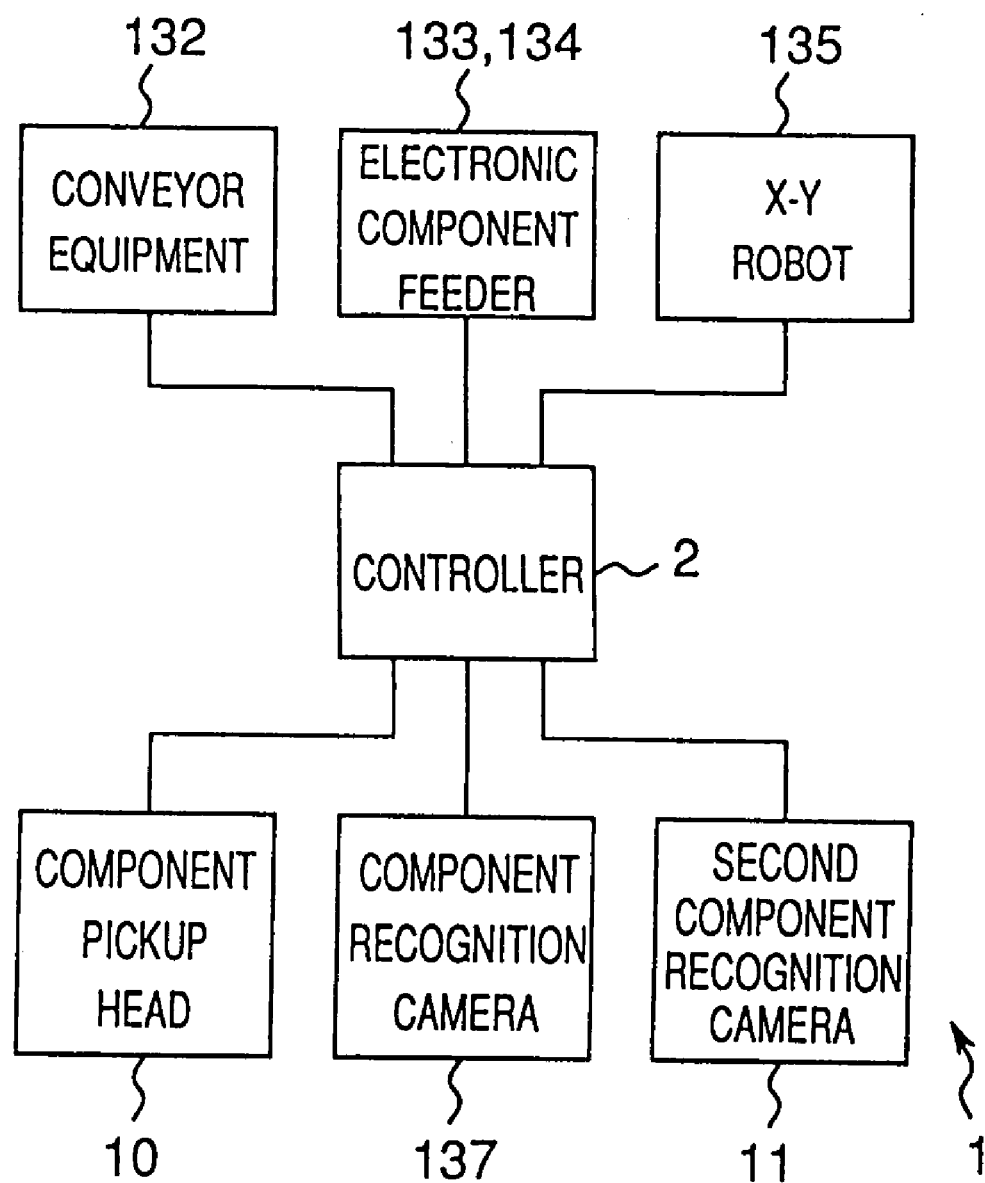
FIG. 2 is a block diagram showing the components of a component mounting apparatus that executes the operation shown in FIG. 1.
Figure 13:
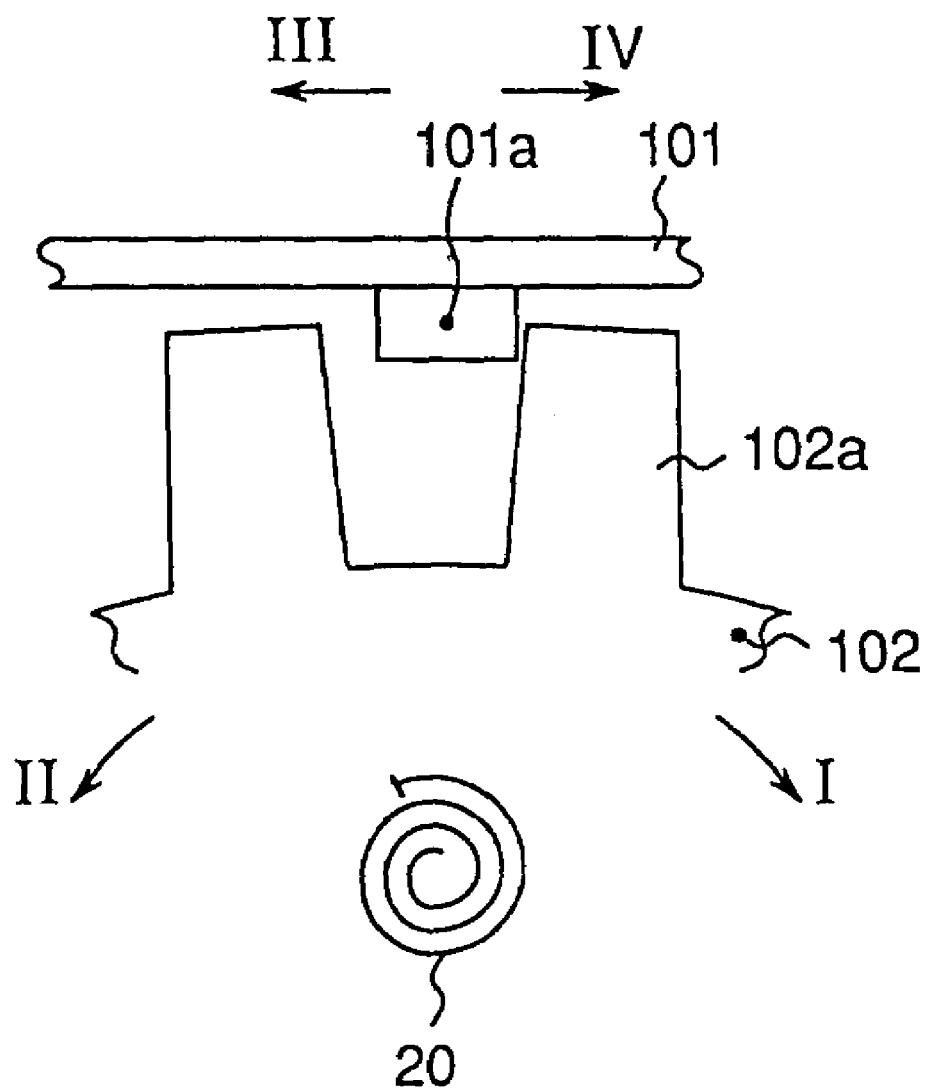
FIG. 13 is a view showing an engagement state between a belt and a gear within the component pickup head of the component mounting apparatus shown in FIG. 2.

As shown in FIG. 2, the component mounting apparatus 1 of this embodiment comprises a conveyor equipment 132, electronic component feeders 133, 134, an X-Y robot 135, a component pickup head 10 and a component recognition camera 137. The construction of these constituent members is principally the same as that of the component mounting apparatus 100 of the conventional art as described with reference to FIG. 14, and so its description is omitted. In addition, the component pickup head 10, which is generally equivalent to the aforementioned component pickup head 136 of the conventional art, is identical in its basic construction to the component pickup head 136, with the difference being that the gear 102 is provided with urging means as described below. Further, the component mounting apparatus 1 of this embodiment differs from the conventional electronic component mounting apparatus 100 in that a controller 2 is provided to perform operational control, as described in detail below, primarily for the component pickup head 10, and that the gear 102 fitted to the pickup nozzle 138 is normally urged in such a direction so as to be rotated in a later described direction II, as shown in FIG. 13, in the component pickup head 10. In addition, the device for urging the gear 102 may be a known device, such as a spiral spring 20 as shown in the figure, for example, in the gear 102.

As a result of the arrangement, in which the gear 102 is urged in direction II as seen above, even if, for example, the belt 101 moves along a direction III such that a tooth 101a of the belt 101 and a tooth 102a of the gear 102 have separated from each other, the gear 102 will be rotated in the II direction due to the urging force when movement of the belt 101 along direction III has stopped or when its moving speed has dropped below a specified value, so that the tooth 102a of the gear 102 comes into contact with the tooth 101a of the belt 101 once again. Accordingly, in the component pickup head 10, when the pickup nozzle 138 rotates in direction II, there will occur no backlash between the tooth 101a of the belt 101 and the tooth 102a of the gear 102 so that no errors will occur in the rotational angle of the pickup nozzle 138. Conversely, when the pickup nozzle 138 rotates in direction I, the aforementioned urging force will not act, so that a backlash will occur between the tooth 101a of the belt 101 and the tooth 102a of the gear 102, in which case an error will occur in the rotational angle of the pickup nozzle 138.

Next described is the operation of the component mounting apparatus 1 of this embodiment. Operations of the convey or equipment 132, the electronic component feeders 133, 134, the X-Y robot 135 and the component recognition camera 137 are the same as in the conventional component mounting apparatus 100, and so their description is omitted. Accordingly, below described in detail is the rotational operation of the pickup nozzle 138 in the component pickup head 10, which is a characteristic operation of this embodiment. Before the detailed description, preconditions will first be explained.

Figure 3:
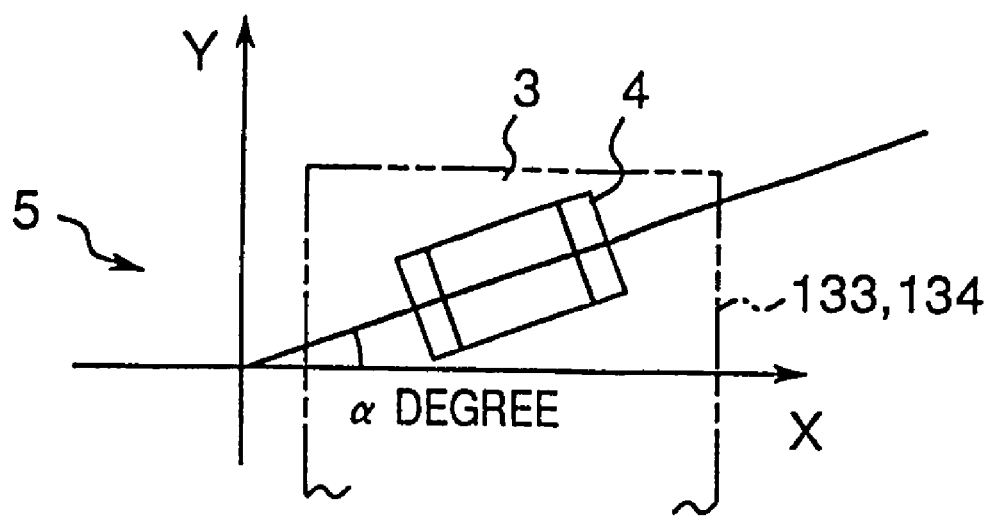
FIG. 3 is a view showing the posture of an electronic component placed in a component pickup position of a component feeder of the component mounting apparatus shown in FIG. 2.
Figure 4:
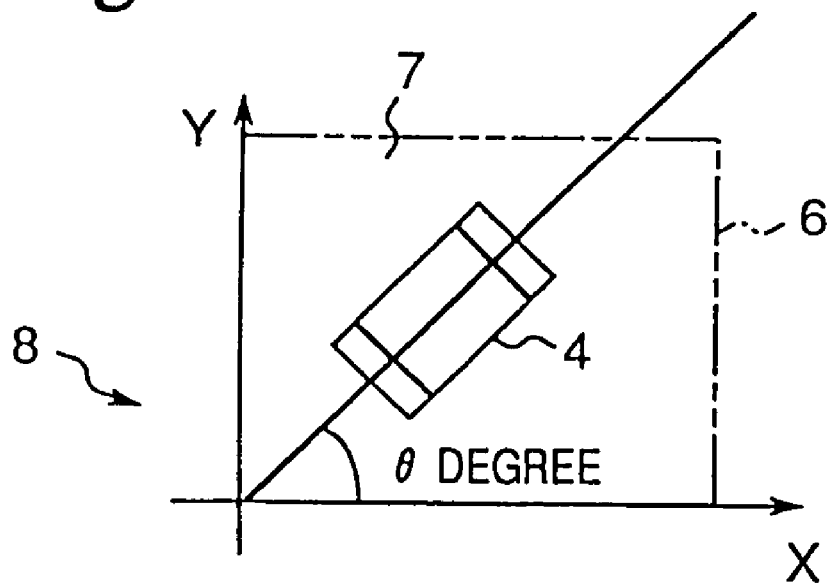
FIG. 4 is a view showing the posture of an electronic component placed in a mounting position on a circuit board in the component mounting apparatus shown in FIG. 2.
Figure 5:
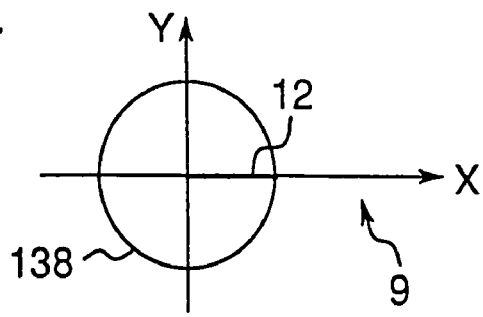
FIG. 5 is a view showing the reference posture of a pickup nozzle of the component mounting apparatus shown in FIG. 2.

As described in connection with the conventional device, and as shown in FIG. 3, the pickup nozzle 138 picks up an electronic component 4 placed in a component pickup position 3 of the component feeder 133 or 134 (hereinafter, the component feeder 133 is taken as an example). An X-Y coordinate system 5 is assumed here to represent the posture of the electronic component 4 in the component pickup position 3 of the component feeder 133. Also, as shown in FIG. 4, an X-Y coordinate system 8 in the circuit board 6 is assumed to represent the mounting posture of the electronic component 4 that has been mounted in a mounting position 7 on the circuit board 6, which is conveyed by the conveyor equipment 132. Also, as shown in FIG. 5, an X-Y coordinate system 9 of the pickup nozzle 138 is assumed with the rotational center of the pickup nozzle 138 taken as the origin. In such a case, generally, because each of the X-Y coordinate systems 5, 8, 9 is an independent coordinate system, it would be necessary to consider shifts of the coordinate axes between the X-Y coordinate systems 5, 8, 9 in order to execute the operations of picking up the electronic component 4 from the component feeder 133 and mounting it to the circuit board 6 by the pickup nozzle 138. However, for an easier understanding, it is assumed hereinbelow that coordinate axes and origins of the X-Y coordinate system 5, the X-Y coordinate system 8 and the X-Y coordinate system 9 are perfectly coincident with one another, respectively. Further, a posture of the pickup nozzle 138 in the direction of rotation about the center axis of the pickup nozzle 138 in which posture the pickup nozzle 138 mounts the electronic component 4 to the mounting position 7 of the circuit board 6 will hereinafter be referred to as reference posture. Also, the X-Y coordinate 9 of the pickup nozzle 138 positioned in the assumed to be coincident with the X-Y coordinate system 8 further, as shown in FIG. 5, with the pickup nozzle 138 positioned in the reference posture, a position of the pickup nozzle 138 along the X-axis in the X-Y coordinate system 9 is represented by numeral 12. When the pickup nozzle 138 picks up the electronic component 4, the pickup nozzle 138 it set to the reference posture. Therefore, it is assumed that the pickup nozzle 138 is positioned in the reference posture when the pickup nozzle 138 picks up the electronic component 4 in the component pickup position 3, and when the pickup nozzle 138 mounts it on the mounting position 7.

Now the operation is explained in detail. Assume that the current time point is a time point when the circuit board 6 has been conveyed and held in the component mounting apparatus 1 by the conveyor equipment 132, where the component mounting operation is going to be started. At Step ("S" in the drawings) 1 in FIG. 1, before the pickup nozzle 138 picks up the electronic component 4 from the component feeder 133, an image of the electronic component 4 in the component pickup position 3 of the component feeder 133 is first captured by a second component recognition camera 11 equipped in the component pickup head 10. Based on this image information, the controller 2 recognizes the posture of the electronic component 4 in the component pickup position 3, and detects a component posture angle α, which is an angle representing a shift from the ideal position of the electronic component 4 placed in the component pickup position 3 as shown in FIG. 3. Since the X-Y coordinate system 5 and the X-Y coordinate system 9 are coincident with each other as described above, the component posture angle α coincides with an angle to which the pickup nozzle 138 should be rotated from the reference posture of the pickup nozzle 138.

Meanwhile, as shown in FIG. 4, the mounting angle θ, which is an angle representing a shift from the basic posture to the mounting posture of the electronic component 4 that has been mounted to the mounting position 7 on the circuit board 6, from data which has previously been recognized by the controller 2 as in the conventional component mounting apparatus 100. In this connection, since the X-Y coordinate system 8 and the X-Y coordinate system 9 are coincident with each other as described above, the mounting angle θ coincides with an angle through which the pickup nozzle 138 should be rotated from the reference posture of the pickup nozzle 138.

Figure 9:
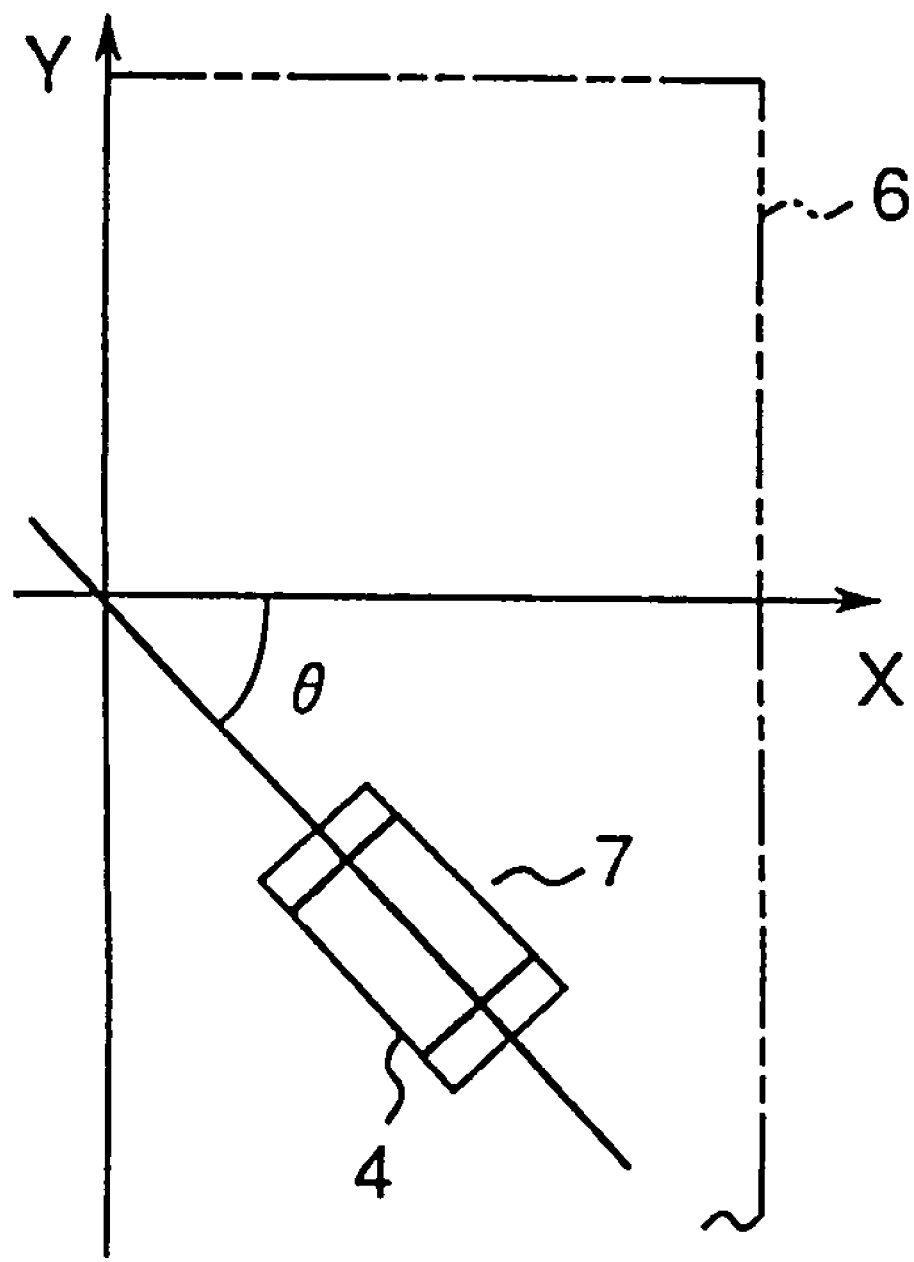
FIG. 9 is a view showing the posture of an electronic component placed in the mounting position on the circuit board in the component mounting apparatus shown in FIG. 2.

Accordingly, at Step 2, the controller 2 calculates a pre-pickup rotational angle $\theta_{PRE}$, which is a value resulting from adding the component posture angle α and the mounting angle θ together. In FIGS. 3, 4 and 9, it is assumed that the angle goes positive counterclockwise beyond the border of the X-axis and negative clockwise. Therefore, the component posture angle α and the mounting angle θ in FIGS. 3 and 4 are positive values while the mounting angle θ in FIG. 9 is a negative value. For example, in the case of FIGS. 3 and 4, since both the component posture angle α and the mounting angle θ are positive, the pre-pickup rotational angle $\theta_{PRE}$ becomes a positive value. Meanwhile, in the case of FIGS. 3 and 9, the component posture angle α is a positive value but the mounting angle θ is a negative value, so that if the mounting angle θ has a value beyond the component posture angle θ, the pre-pickup rotational angle $\theta_{PRE}$ becomes a negative value.

Figure 6:
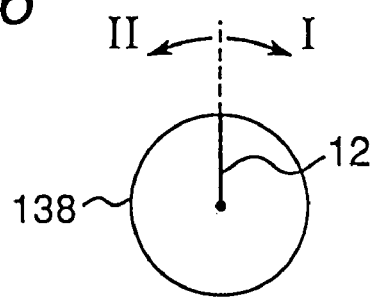
FIG. 6 is a view showing the direction of rotation from the reference posture in the pickup nozzle shown in FIG. 5.

At Step 3, it is decided whether the pre-pickup rotational angle $\theta_{PRE}$ is zero, positive or negative. If the pre-pickup rotational angle $\theta_{PRE}$ is decided to be zero or positive, then the program moves to Step 4. If the mounting angle $\theta_{PRE}$ is decided to be negative, then the program moves to Step 7. It is noted that if the pre-pickup rotational angle $\theta_{PRE}$ is decided to be zero or positive, the pickup nozzle 138 is rotated in direction I as shown in FIG. 6, which is clockwise as an example, from the reference posture. Meanwhile, if the pre-pickup rotational angle $\theta_{PRE}$ is decided to be negative, the pickup nozzle 138 is rotated in direction II as shown in FIG. 6, which is counterclockwise as an example, from the reference posture.

Figure 7:
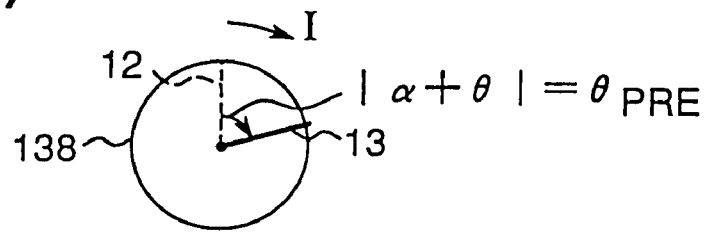
FIG. 7 is a view showing the rotational direction and angle of the pickup nozzle at Step 4 shown in the flow chart of FIG. 1.

For example, if the pre-pickup rotational angle $\theta_{PRE}$ is decided to be positive as in the case of FIGS. 3 and 4, the controller 2 at Step 4 preliminarily rotates the pickup nozzle 138 in direction I from the reference posture to an extent of the absolute value of the prepickup rotational angle $\theta_{PRE}$, i.e., to an extent of $|(+\alpha)+(+\theta)|$, as shown in FIG. 7, before the suction of the component 4. In FIG. 7, the position 12 after rotation of the pickup nozzle 138 is indicated by numeral 13. Also, when the pickup nozzle 138 is rotated in the direction I, an error corresponding to the backlash is included in the rotational angle of the pickup nozzle 138 as described above.

Then at Step 5, the electronic component 4 is picked up in the component pickup position 3 of the component feeder 133 by the pickup nozzle 138 that has been rotated as described above.

Figure 8:
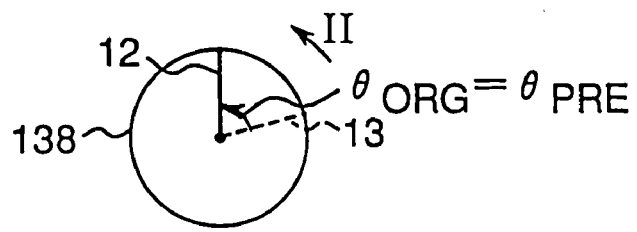
FIG. 8 is a view showing the rotational direction and angle of the pickup nozzle at Step 6 shown in the flow chart of FIG. 1.

Next at Step 6, as shown in FIG. 8, the controller 2 rotates the pickup nozzle 138 in direction II from the position 13 to an extent of the absolute value of the pre-pickup rotational angle $\theta_{PRE}$, i.e., to an extent of $|(+\alpha)+(+\theta)|$. As described before, when the pickup nozzle 138 is rotated in direction II, an error corresponding to the backlash is not included in the rotational angle of the pickup nozzle 138. Accordingly, at a time point when the operation of Step 6 is completed, the pickup nozzle 138 is at a position that is coincident with the reference posture again.

Therefore, at Step 11, which is the step succeeding Step 6, the component pickup head 10 is moved to the mounting position 7 of the circuit board 6 by the X-Y robot 135, and then the pickup nozzle 138 is lowered so that the electronic component 4, held by the pickup nozzle 138 in the state of Step 6, is mounted on the circuit board 6. Through these operations, the electronic component 4 is mounted in the mounting position 7 of the circuit board 6.

Figure 10:
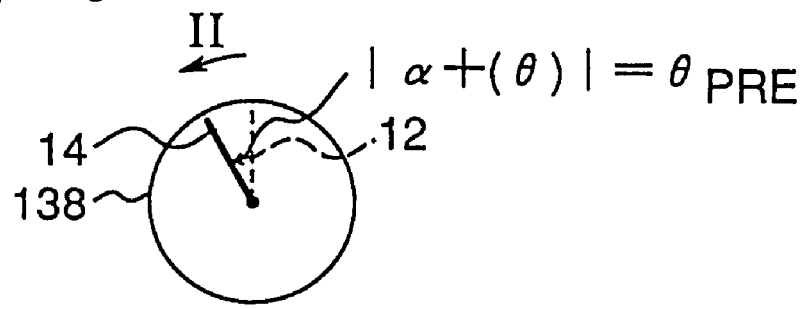
FIG. 10 is a view showing the rotational direction and angle of the pickup nozzle at Step 7 shown in the flow chart of FIG. 1;.

Meanwhile, when the pre-pickup rotational angle $\theta_{PRE}$ is determined to be negative, for example as shown in FIGS. 3 and 9, the controller 2 at Step 7, before the pickup (suction) of the electronic component 4, preliminarily rotates the pickup nozzle 138 in direction II from the reference posture to an extent of the absolute value of the pre-pickup rotational angle $\theta_{PRE}$, i.e., to an extent of $|(+\alpha)+(+\theta)|$, as shown in FIG. 10. In FIG. 10, the position where the position 12 comes after the rotation of the pickup nozzle 138 is indicated by numeral 14.

Then, at Step 8, the electronic component 4 is picked up in the component pickup position 3 of the component feeder 133 by the pickup nozzle 138 that has been rotated as described above.

With regard to the pickup nozzle 138 that has been rotated in direction II from the reference posture as described above, when the pickup nozzle 138 is rotated merely in direction I so as to be returned to the reference posture for the mounting of the electronic component 4 to the circuit board 6, a rotational error would be included in the rotation of the pickup nozzle 138 in direction I as described before, such that the electronic component 4 would not coincide with the mounting position 7 on the circuit board 6 in the rotational direction of the pickup nozzle 138. Therefore, operations of the following Step 9 and Step 10 are executed when the pre-pickup rotational angle $\theta_{PRE}$ is negative.

Figure 11:
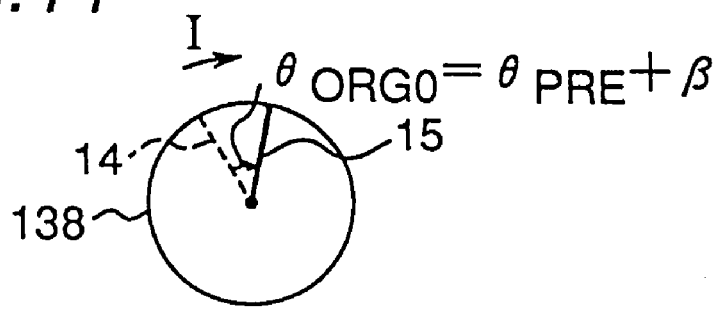
FIG. 11 is a view showing the rotational direction and angle of the pickup nozzle at Step 9 shown in the flow chart of FIG. 1.

At Step 9, as shown in FIG. 11, the controller 2 rotates the pickup nozzle 138 in direction I from the position 14 through an angle resulting from further adding a return angle β to the absolute value of the pre-pickup rotational angle $\theta_{PRE}$, i.e. |(+α)+(+θ)|. In this case, the return angle β is an angle having a positive value which is sufficiently smaller than the component posture angle α. In FIG. 11, the position where the position 12 comes after the rotation of the pickup nozzle 138 is indicated by numeral 15.

Figure 12:
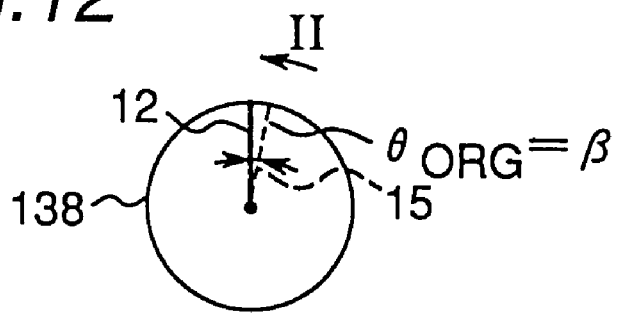
FIG. 12 is a view showing the rotational direction and angle of the pickup nozzle at Step 10 shown in the flow chart of FIG. 1.

Next at Step 10, as shown in FIG. 12, the controller 2 rotates the pickup nozzle 138 in direction II from position 15 through the return angle β. With the rotation in direction 11 at Step 10, an error corresponding to the backlash will not be included in the rotational angle of the pickup nozzle 138 as described before. Accordingly, the position of the pickup nozzle 138 is again coincident with the reference posture at a time point when the operation of Step 10 is completed.

Therefore, at Step 11, which is the step succeeding Step 10, the component pickup head 10 is moved to the mounting position 7 of the circuit board 6 by the X-Y robot 135, and then the pickup nozzle 138 is lowered so that the electronic component 4, held by the pickup nozzle 138 in the state of Step 10, is mounted on the circuit board 6. Through these operations, the electronic component 4 is mounted in the mounting position 7 of the circuit board 6.

As described above, in this embodiment, before the electronic component 4, which is an object to be mounted, is picked up by the pickup nozzle 138 from the component feeder 133, the posture of the electronic component 4 in the component pickup position 3 of the component feeder 133 is recognized by the second recognition camera 11. Then, the pickup nozzle 138 is preliminarily rotated through a pre-pickup rotational angle $\theta_{PRE}$ that results from adding a component posture angle a obtained by this recognition and the mounting angle θ together, and afterwards the electronic component 4 is picked up. Further, when the picked-up electronic component 4 is finally rotated to the mounting angle, it will be rotated in direction II in which no error will occur in the rotation of the pickup nozzle 138. Through these operations, the electronic component 4 can be mounted correctly in the mounting position 7 without any lost motions of the pickup nozzle 138 in the rotational direction.

Also when the rotation of the pickup nozzle 138 is fulfilled by means of a ball screw, high precision positioning is enabled by a mounting method similar to that of this embodiment.

Although the pickup nozzle 138 moves thicknesswise of the circuit board 6 so that the direction of movement of the pickup nozzle 138 is coincident with the direction of the rotational axis of the pickup nozzle 138 in this embodiment, there are some cases where these are not coincident. In such a case, when the electronic component 4 is rotated to the mounting angle, the center of the electronic component 4 would move in the (X,Y) directions, in which case the quantity of the movement should additionally be corrected by a known method.

In addition, in the above-described embodiment, the posture of the electronic component 4 is recognized by the component recognition camera 137 before the electronic component 4 is picked up from the component feeder 133 by the pickup nozzle 138. However, without being limited to this, the posture of the electronic component 4 may be recognized by the component recognition camera 137 after the electronic component 4 has been picked up from the component feeder 133 by the pickup nozzle 138, where the resulting angle is taken as the component posture angle α. Furthermore, the component posture angle α may be obtained by recognizing the posture of the electronic component 4 both before and after the pickup to determine component posture angles α-1 and α-2, and by adding these values to determine the component posture angle Also, this embodiment has been described to show a case where the component posture angle α is taken into consideration. However, when the posture of the electronic component 4 in the component pickup position 3 of the component feeder 133 is undoubtedly coincident with its ideal posture, there is no need of taking into consideration the component posture angle α.

As described in detail above, according to the component mounting method of the first aspect of the invention and to the component mounting apparatus of the fourth aspect of the invention, a controller is provided so that the following operations are executed by the controller. That is, before the mounting of the component on the circuit board, the nozzle is rotated to a mounting angle in such a direction so as to depart from the reference posture of the nozzle, and afterwards, the nozzle is rotated in a specified direction so as to be finally returned to the reference posture, in which state the component is mounted on the circuit board. Like this, the nozzle is rotated in such a specified direction that no rotational errors occur with respect to the nozzle, so that a component mounting operation at a high-precision mounting angle can be accomplished.

Also, according to the component mounting method of the second and third aspects of the invention and to the component mounting apparatus of the fifth and sixth aspects of the invention, a controller is provided so that the following operations are executed by the controller. That is, a component posture angle is obtained by recognizing the posture of the component in the component feeder with a component recognition device. Then, a pre-pickup rotational angle is determined based on the component posture angle and a mounting angle, and the nozzle is rotated to the pre-pickup rotational angle in such a direction as to depart from the reference posture of the nozzle, and afterwards, the nozzle is rotated in a specified direction so as to be finally returned to the reference posture, in which state the component is mounted on the circuit board. Like this, the component posture angle, based on the posture of the component in the component feeder, is considered and, just before the mounting of the component, the nozzle is rotated in such a specified direction so as to cause no errors in the nozzle, so that a component can be mounted with a higher-precision mounting angle.

The entire disclosure of Japanese Patent Application No. 3-34759 filed on Dec. 26, 1996, including specification, claims, drawings, and summary are incorporated herein by reference in its entirety.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A component mounting method comprising:
   while a component is accommodated within a component feeder, using a recognition device to recognize said component and thereby detect, as a component posture angle, a posture of said component relative to an ideal posture of said component;

calculating a pre-holding rotational angle from a mounting angle and said component posture angle, with said mounting angle corresponding to a posture of said component, that said component is to exhibit when mounted on said object, relative to a basic posture of said component;

rotating a component holding member by said pre-holding rotational angle in one direction from a reference posture of said component holding member to a rotated position;

using said component holding member, while in said rotated position, to remove said component from said component feeder and hold said component; then rotating said component holding member, while holding said component, to said reference posture; and then mounting said component onto an object, wherein rotating said component holding member, by said pre-holding rotational angle, in said one direction from said reference posture of said component holding member to said rotated position comprises rotating said component holding member about an axis thereof by a driving device via a transfer member that causes an error to result in an amount that said component holding member is rotated only when said component holding member is rotated in a first direction, and does not cause an error to result in an amount that said component holding member is rotated when said component holding member is rotated in a second direction opposite to said first direction.

2. The component mounting method according to claim 1, wherein
mounting said component onto said object comprises using said component holding member to mount said component onto said object.

3. The component mounting method according to claim 2, wherein
said driving device includes an output shaft having a first gear thereon,
said component holding member includes a second gear, and
said transfer member comprises a toothed belt coupling said first gear and said second gear.

4. The component mounting method according to claim 3, wherein
an error being caused to result in an amount that said component holding member is rotated only when said component holding member is rotated in said first direction, and not being caused to result when said component holding member is rotated in said second direction, arises from said second gear being normally biased in said second direction against said toothed belt such that when said component holding member is rotated in said first direction an error corresponding to a backlash between said second gear and said toothed belt results, whereas when said component holding member is rotated in said second direction no backlash occurs between said second gear and said toothed belt such that no error is caused to result in an amount that said component holding member is rotated.

5. The component mounting method according to claim 2, wherein rotation of said component holding member from said reference posture of said component holding member in said first direction corresponds to rotation through a positive angle, and rotation of said component holding member from said reference posture of said component holding member in said second direction corresponds to rotation through a negative angle, such that (i) if said one direction is said first direction, or if said pre-holding rotational angle is zero, rotating said component holding member, while holding said component, to said reference posture comprises using said transfer member to rotate said component holding member in said second direction by an amount equal to said pre-holding rotational angle, and (ii) if said one direction is said second direction, rotating said component holding member, while holding said component, to said reference posture comprises using said transfer member to
(a) rotate said component holding member in said first direction by an amount equal to said pre-holding rotational angle plus a return angle, and then
(b) rotate said component holding member in said second direction by an amount equal to said return angle.

6. The component mounting method according to claim 5, wherein
said driving device includes an output shaft having a first gear thereon,
said component holding member includes a second gear, and
said transfer member comprises a toothed belt coupling said first gear and said second gear.

7. The component mounting method according to claim 6, wherein
an error being caused to result in an amount that said component holding member is rotated only when said component holding member is rotated in said first direction, and not being caused to result when said component holding member is rotated in said second direction, arises from said second gear being normally biased in said second direction against said toothed belt such that when said component holding member is rotated in said first direction an error corresponding to a backlash between said second gear and said toothed belt results, whereas when said component holding member is rotated in said second direction no backlash occurs between said second gear and said toothed belt such that no error is caused to result in an amount that said component holding member is rotated.

8. The component mounting method according to claim 1, wherein
calculating a pre-holding rotational angle from said mounting angle and said component posture angle comprises calculating said pre-holding rotational angle by adding said mounting angle to said component posture angle.

9. The component mounting method according to claim 8, wherein
mounting said component onto said object comprises using said component holding member to mount said component onto said object.

10. The component mounting method according to claim 9, wherein
said driving device includes an output shaft having a first gear thereon,
said component holding member includes a second gear, and
said transfer member comprises a toothed belt coupling said first gear and said second gear.

11. The component mounting method according to claim 10, wherein an error being caused to result in an amount that said component holding member is rotated only when said component holding member is rotated in said first direction, and not being caused to result when said component holding member is rotated in said second direction, arises from said second gear being normally biased in said second direction against said toothed belt such that when said component holding member is rotated in said first direction an error corresponding to a backlash between said second gear and said toothed belt results, whereas when said component holding member is rotated in said second direction no backlash occurs between said second gear and said toothed belt such that no error is caused to result in an amount that said component holding member is rotated.

12. The component mounting method according to claim 9, wherein rotation of said component holding member from said reference posture of said component holding member in said first direction corresponds to rotation through a positive angle, and rotation of said component holding member from said reference posture of said component holding member in said second direction corresponds to rotation through a negative angle, such that (i) if said one direction is said first direction, or if said pre-holding rotational angle is zero, rotating said component holding member, while holding said component, to said reference posture comprises using said transfer member to rotate said component holding member in said second direction by an amount equal to said pre-holding rotational angle, and (ii) if said one direction is said second direction, rotating said component holding member, while holding said component, to said reference posture comprises using said transfer member to (a) rotate said component holding member in said first direction by an amount equal to said pre-holding rotational angle plus a return angle, and then (b) rotate said component holding member in said second direction by an amount equal to said return angle.

13. The component mounting method according to claim 12, wherein said driving device includes an output shaft having a first gear thereon, said component holding member includes a second gear, and said transfer member comprises a toothed belt coupling said first gear and said second gear.

14. The component mounting method according to claim 13, wherein an error being caused to result in an amount that said component holding member is rotated only when said component holding member is rotated in said first direction, and not being caused to result when said component holding member is rotated in said second direction, arises from said second gear being normally biased in said second direction against said toothed belt such that when said component holding member is rotated in said first direction an error corresponding to a backlash between said second gear and said toothed belt results, whereas when said component holding member is rotated in said second direction no backlash occurs between said second gear and said toothed belt such that no error is caused to result in an amount that said component holding member is rotated.

* * * * *